United States Patent
Yu et al.

(10) Patent No.: US 9,852,977 B2
(45) Date of Patent: Dec. 26, 2017

(54) PACKAGE SUBSTRATE

(71) Applicant: PHOENIX PIONEER TECHNOLOGY CO., LTD., Hsinchu County (TW)

(72) Inventors: Chun-Hsien Yu, Hsinchu County (TW); Pao-Hung Chou, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/351,838

(22) Filed: Nov. 15, 2016

(65) Prior Publication Data
US 2017/0148724 A1    May 25, 2017

(30) Foreign Application Priority Data
Nov. 20, 2015   (TW) .................................. 104138581

(51) Int. Cl.
| H05K 1/00 | (2006.01) |
| H01L 23/498 | (2006.01) |
| H05K 1/11 | (2006.01) |
| H05K 1/03 | (2006.01) |

(52) U.S. Cl.
CPC .. *H01L 23/49894* (2013.01); *H01L 23/49822* (2013.01); *H01L 23/49827* (2013.01); *H01L 23/49838* (2013.01); *H05K 1/036* (2013.01); *H05K 1/0393* (2013.01); *H05K 1/115* (2013.01)

(58) Field of Classification Search
CPC ...... H05K 1/115; H05K 1/0393; H05K 1/036; H01L 23/49894; H01L 23/49822; H01L 23/49827; H01L 23/49838
USPC .......................... 174/254, 255, 258; 361/749
See application file for complete search history.

(56) References Cited

U.S. PATENT DOCUMENTS

| 5,072,074 A * | 12/1991 | DeMaso .............. H05K 3/4691 156/123 |
| 8,519,528 B1 * | 8/2013 | Nagarajan ............. H01L 23/147 257/698 |
| 2004/0003940 A1 * | 1/2004 | Bai ........................ H05K 3/28 174/258 |
| 2004/0126547 A1 * | 7/2004 | Coomer .............. H01L 21/4857 428/209 |
| 2011/0115050 A1 * | 5/2011 | Lin ....................... H01L 23/145 257/532 |
| 2011/0155433 A1 * | 6/2011 | Funaya ............. H01L 23/49827 174/258 |
| 2012/0279770 A1 * | 11/2012 | Nagata .................. B32B 37/025 174/258 |
| 2013/0213695 A1 * | 8/2013 | Lee ....................... H05K 1/0278 174/254 |
| 2013/0318785 A1 * | 12/2013 | Hsu ........................ H05K 3/108 29/850 |
| 2015/0364408 A1 * | 12/2015 | Hsu ................... H01L 23/49822 361/783 |

* cited by examiner

*Primary Examiner* — Sherman Ng
(74) *Attorney, Agent, or Firm* — WPAT, PC

(57) ABSTRACT

This disclosure provides a package substrate which includes a rigid dielectric material layer, a first wiring layer having at least one first metal wire formed on the rigid dielectric material layer, and a first flexible dielectric material layer formed on the first wiring layer.

16 Claims, 3 Drawing Sheets

PACKAGE SUBSTRATE

CROSS REFERENCE TO RELATED APPLICATION

This application claims the benefit of Taiwan application Serial No. 104138581, filed on Nov. 20, 2015, the disclosure of which is incorporated by reference herein in its entirety.

FIELD OF THE INVENTION

The present invention relates to a package substrate applicable to circuit boards of copper connection in molding (C2iM), printed-circuit board (PCB) and coreless substrate.

BACKGROUND OF THE INVENTION

As recent rapid trend in modern electronic devices is not only toward thinner, lighter and smaller devices, but also toward multifunctional and high-performance devices, the integrated-circuit (IC) fabrication and technology has to evolve correspondingly toward a more high-density and miniature design so as to allow more electronic components to be received inside limited chip space. Consequently, the relating IC package substrate and the package technology are evolved accordingly to meet the trend.

In the art, the package substrates formed by molding dielectric material have the advantage of fine-pitch wiring and slimmed substrate, and thus are particularly applicable to the camera lens modules for mobile electronic devices. However, the material conventionally used in the molding technique is epoxy molding compound (EMC), which is rigid and fragile after curing. This causes the fact that the semi-finished package substrates are subject to damage or cracks in the fabrication process after molding. Therefore, it is in need of a new and advanced packaging solution.

SUMMARY OF THE INVENTION

According to one aspect of the present disclosure, one embodiment provides a package substrate, which comprises a rigid dielectric material layer; a first wiring layer having at least one first metal wire formed on the rigid dielectric material layer; and a first flexible dielectric material layer formed on the first wiring layer.

In one embodiment, the rigid dielectric material layer is made of a material selected from the group consisting of epoxy molding compound (EMC), FR-4 glass-fabric epoxy resin, FR-5 glass-fabric epoxy resin, bismaleimide triazine (BT) resin, and ajinomoto build-up film (ABF) resin.

In one embodiment, the first flexible dielectric material layer is made of a material selected from the group consisting of polyimide (PI), polyethylene naphthalate (PEN), liquid crystal plastic (LCP), polyethylene terephthalate (PET) and polytetrafluoroethylene (PTFE).

In one embodiment, the package substrate further comprises a second flexible dielectric material layer formed below the rigid dielectric material layer.

In one embodiment, the package substrate further comprises a second wiring layer having at least one second metal wire formed between the rigid dielectric material layer and the second flexible dielectric material layer.

In one embodiment, the package substrate further comprises a conductive connection unit connecting the first wiring layer with the second wiring layer through the rigid dielectric material layer.

According to one aspect of the present disclosure, one embodiment provides a package substrate, which comprises a first flexible dielectric material layer; a first wiring layer having at least one first metal wire formed on the first flexible dielectric material layer; a multi-layered dielectric layer formed on the first wiring layer; a second wiring layer having at least one second metal wire formed on the multi-layered dielectric layer; and a second flexible dielectric material layer formed on the second wiring layer; wherein the multi-layered dielectric layer comprises a first rigid dielectric material layer, a third flexible dielectric material layer formed on the first rigid dielectric material layer, and a second rigid dielectric material layer formed on the third flexible dielectric material layer.

In one embodiment, the package substrate further comprises a conductive connection unit connecting the first wiring layer with the second wiring layer through the multi-layered dielectric layer.

In one embodiment, each of the first and second rigid dielectric material layers is made of a material selected from the group consisting of EMC, FR-4 glass-fabric epoxy resin, FR-5 glass-fabric epoxy resin, BT resin, and ABF resin.

In one embodiment, each of the first, second and third flexible dielectric material layers is made of a material selected from the group consisting of PI, PEN, LCP, PET and PTFE.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/ below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

The present invention relates to a package substrate applicable to the C2iM-based, PCB-based, or coreless-substrate-based circuit boards. Some embodiments will be described first in the following paragraphs, and then the way they applied to package the C2iM-based, PCB-based, and coreless-substrate-based circuit board will be explained in detail.

Figure 1:
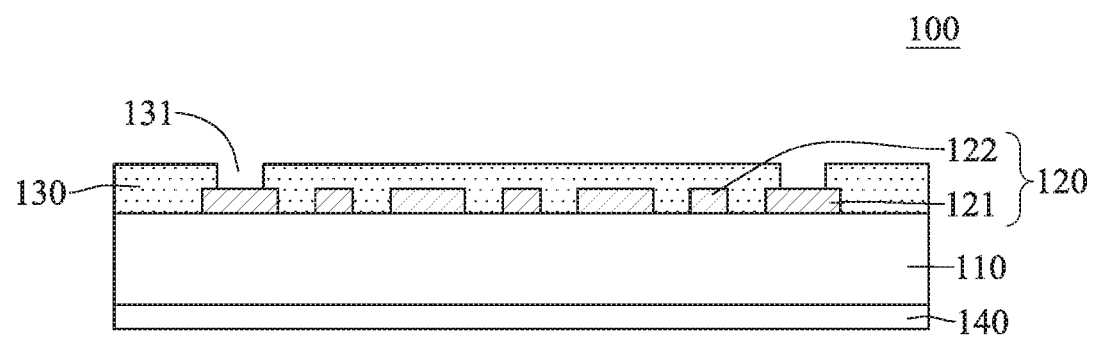
FIG. 1 is a cross-sectional view of a package substrate according to a first embodiment of the present invention.

Please refer to FIG. 1, which is a cross-sectional view of a package substrate 100 according to a first embodiment of the present invention. The package substrate 100 comprises: a rigid dielectric material layer 110, a first wiring layer 120 and a first flexible dielectric material layer 130. The rigid dielectric material layer 110 is used for supporting and carrying the whole package substrate 100, e.g. the first wiring layer 120 on the rigid dielectric material layer 110. If the package substrate 100 is C2iM-based or coreless substrate-based, the rigid dielectric material layer 110 may be made of epoxy molding compound (EMC), bismaleimide triazine (BT) resin, or ajinomoto build-up film (ABF) resin. Otherwise, if the package substrate 100 is PCB-based, the rigid dielectric material layer 110 may be made of glass-fabric epoxy resin such as FR-4 or FR-5. The above-recited dielectric materials are rigid and fragile after curing, and thus are subject to damage or cracks in the fabrication and assembly process of the device like stamping press.

The first wiring layer 120 includes first metal wires 121 and 122, which can be formed by means of photolithography, acting as lower-layer conductive wiring of the package substrate 100. For example, a metal layer of Cu, Ni, Sn, Ni/Au or their combination is formed on the rigid dielectric material layer 110 by evaporating or sputtering. A photoresist layer (not shown) is then coated on the metal layer and patterned by photolithography. The metal layer is then treated by etching with the patterned photoresist layer acting as an etching mask, so that the metal layer below the etching mask stays on the rigid dielectric material layer 110 to be the first wiring layer 120 in the embodiment. As shown in FIG. 1, the first metal wires 121 have a width different from that of the first metal wires 122. But it is not limited thereto; the first wiring layer 120 may further include metal wires with a different width.

The first flexible dielectric material layer 130 is formed on the first wiring layer 120 with openings 131 arranged therein to be pre-determined paths, through which the first wiring layer 120 can be connected to an external circuit (not shown). The first flexible dielectric material layer 130 can be made of polymer material such as polyimide (PI), polyethylene naphthalate (PEN), liquid crystal plastic (LCP), polyethylene terephthalate (PET) and polytetrafluoroethylene (PTFE). Because the first flexible dielectric material layer 130 is bond to the rigid dielectric material layer 110 jointly, its elasticity and flexibility can prevent the rigid dielectric material layer 110 from being fragile and damaged in the fabrication process of the device. Moreover, the first flexible dielectric material layer 130 covers the first metal wires 121 and 122 to be the outermost part of the package substrate 100, so it can protect the package substrate 100 from being damaged due to external objects or the subsequent fabrication process like soldering.

In another embodiment, a second flexible dielectric material layer 140 can be further formed below the rigid dielectric material layer 110. As shown in FIG. 1, both the rigid dielectric material layer 110 and the first wiring layer 120 are sandwiched between the first flexible dielectric material layer 130 and the second flexible dielectric material layer 140. The combination of the two flexible layers 130 and 140 can further improve the elasticity and flexibility of the package substrate 100. The second flexible dielectric material layer 140 can be also made of polymer material such as PI, PEN, LCP, PET and PTFE, and the second flexible dielectric material layer 140 can have a composition the same as or different from that of the first flexible dielectric material layer 130.

Figure 2:
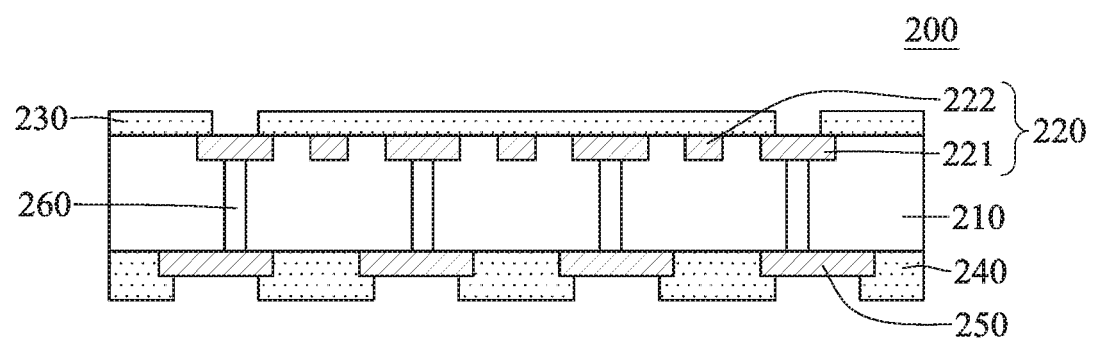
FIG. 2 is a cross-sectional view of a package substrate according to a second embodiment of the present invention.

FIG. 2 is a cross-sectional view of a package substrate 200 according to a second embodiment of the present invention. The package substrate 200 comprises: a rigid dielectric material layer 210, a first wiring layer 220, a first flexible dielectric material layer 230, a second flexible dielectric material layer 240, a second wiring layer 250 and a conductive connection unit 260; that is, the package substrate 200 is a package substrate device with two layers of wiring 220 and 250. The package substrate 200 is in many ways identical to the package substrate 100 of the first embodiment in FIG. 1. However, in contrast to the first metal wires 121 and 122 which are disposed totally on the top surface of the rigid dielectric material layer 110, the first metal wires 221 and 222 are embedded in the rigid dielectric material layer 210 in this embodiment, due to different fabrication processes. But it is not limited thereto; the first metal wires 221 and 222 can be disposed totally on the rigid dielectric material layer 210 in another embodiment.

The second wiring layer 250 includes at least one second metal wire between the rigid dielectric material layer 210 and the second flexible dielectric material layer 240. The second metal wires 250 may be made of Cu, Ni, Sn, Ni/Au or their combination and act as upper-layer conductive wiring of the package substrate 200. Thus, the package substrate 200 has two layers of wiring with the first wiring layer 220 on the rigid dielectric material layer 210 and the second wiring layer 250 below the rigid dielectric material layer 210.

In one embodiment, the package substrate 200 may further include a conductive connection unit 260 in the rigid dielectric material layer 210, to connect the first wiring layer 220 with the second wiring layer 250 through the rigid dielectric material layer 210. For example, if the package substrate 200 is structurally C2iM-based, the conductive connection unit 260 can be metal pillars, e.g. copper pillars, penetrating the rigid dielectric material layer 210. On the other aspect, if the package substrate 200 is structurally based on a PCB or a coreless substrate, the conductive connection unit 260 can be conductive channels penetrating the rigid dielectric material layer 210, filled with conductive material like Cu, Al, and Sn.

Figure 3:
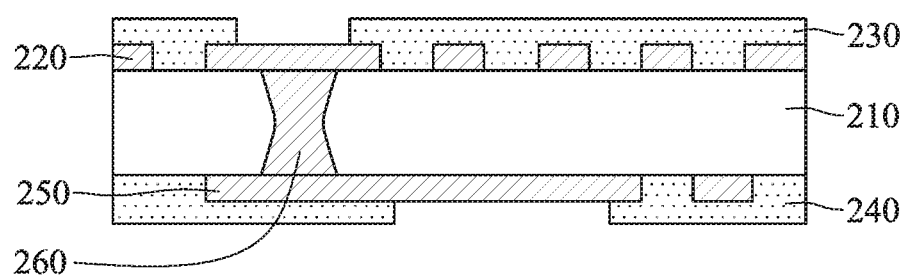
FIG. 3 is a cross-sectional view of a PCB-based package substrate according to the second embodiment.
Figure 4:
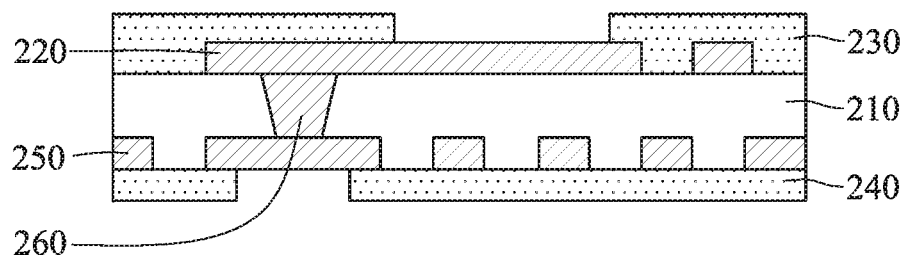
FIG. 4 is a cross-sectional view of a coreless-substrate-based package substrate according to the second embodiment.

More embodiments can be derived from the package substrate 200 in FIG. 2. FIG. 3 is a cross-sectional view of a PCB-based package substrate according to the second embodiment, in which a PCB of FR-4 or FR-5 is used as the rigid dielectric material layer 210. FIG. 4 is a cross-sectional view of a coreless-substrate-based package substrate according to the second embodiment, in which the rigid dielectric material layer 210 is made of EMC, BT resin, or ABF resin.

Figure 5:
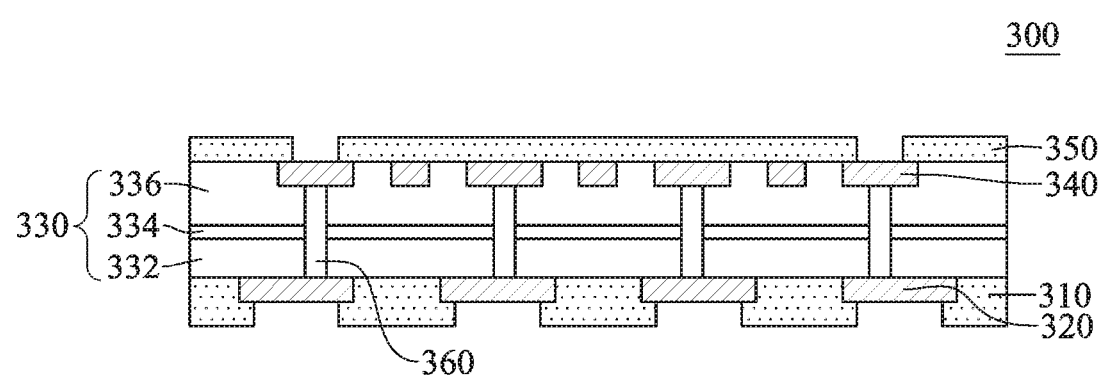
FIG. 5 is a cross-sectional view of a package substrate according to a third embodiment of the present invention.

FIG. 5 is a cross-sectional view of a package substrate 300 according to a third embodiment of the present invention. The package substrate 300 comprises: a first flexible dielectric material layer 310, a first wiring layer 320, a multi-layered dielectric layer 330, a second wiring layer 340 and a second flexible dielectric material layer 350; that is, the package substrate 300 is a package substrate device with multiple wiring layers. The first flexible dielectric material layer 310, the first wiring layer 320, the second wiring layer 340 and the second flexible dielectric material layer 350 are basically identical to the second flexible dielectric material layer 240, the second wiring layer 250, the first wiring layer 220 and the first flexible dielectric material layer 230 of the second embodiment in FIG. 2. In contrast, the rigid dielectric material layer 210 of the second embodiment is replaced with the multi-layered dielectric layer 330 in the current embodiment. The multi-layered dielectric layer 330 may include a first rigid dielectric material layer 332, a third flexible dielectric material layer 334 formed on the first rigid dielectric material layer 332, and a second rigid dielectric material layer 336 formed on the third flexible dielectric material layer 334. The third flexible dielectric material layer 334 can be made of polymer material such as PI, PEN, LCP, PET and PTFE, also. As shown in FIG. 5, the first rigid dielectric material layer 332 is sandwiched between the flexible dielectric material layers 310 and 334, and the second rigid dielectric material layer 336 is sandwiched between the flexible dielectric material layers 334 and 350. The combination of alternating flexible and rigid layers can further improve the elasticity and flexibility of the package substrate 300.

In one embodiment, the package substrate 300 may further include a conductive connection unit 360 in the multi-layered dielectric layer 330, to connect the first wiring layer 320 with the second wiring layer 340 through the multi-layered dielectric layer 330. For example, if the package substrate 300 is structurally C2iM-based, the conductive connection unit 360 can be metal pillars, e.g. copper pillars, penetrating the multi-layered dielectric layer 330. On the other aspect, if the package substrate 300 is structurally based on a PCB or a coreless substrate, the conductive connection unit 360 can be conductive channels penetrating the multi-layered dielectric layer 330, filled with conductive material like Cu, Al, and Sn.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package substrate comprising:
   a rigid epoxy molding compound (EMC) layer;
   a first wiring layer having at least one first metal wire formed on the rigid EMC layer; and
   a first flexible dielectric material layer formed on the first wiring layer, wherein said first flexible dielectric material layer defines an outermost surface of said package substrate, and said first flexible dielectric material layer comprises an opening providing external access to said first metal wire.

2. The package substrate of claim 1, wherein the first flexible dielectric material layer is made of a material selected from the group consisting of polyethylene naphthalate (PEN), liquid crystal plastic (LCP), polyethylene terephthalate (PET) and polytetrafluoroethylene (PTFE).

3. The package substrate of claim 1, further comprising:
   a second flexible dielectric material layer formed below the rigid EMC layer.

4. The package substrate of claim 3, further comprising:
   a second wiring layer having at least one second metal wire formed between the rigid EMC layer and the second flexible dielectric material layer.

5. The package substrate of claim 4, further comprising:
   a conductive connection unit connecting the first wiring layer with the second wiring layer through the rigid EMC layer.

6. The package substrate of claim 1, wherein said first flexible dielectric material layer comprises polyethylene naphthalate.

7. The package substrate of claim 1, wherein said first flexible dielectric material layer comprises liquid crystal plastic.

8. The package substrate of claim 1, wherein said first flexible dielectric material layer comprises polyethylene terephthalate.

9. The package substrate of claim 1, wherein said first flexible dielectric material layer comprises polytetrafluoroethylene.

10. A package substrate comprising:
    a first flexible dielectric material layer, defining an outermost surface of said package substrate and comprising an opening;
    a first wiring layer having at least one first metal wire formed on the first flexible dielectric material layer, wherein said first metal wire is externally accessible through said opening;
    a multi-layered dielectric layer formed on the first wiring layer;
    a second wiring layer having at least one second metal wire formed on the multi-layered dielectric layer; and
    a second flexible dielectric material layer formed on the second wiring layer;
    wherein the multi-layered dielectric layer comprises a first epoxy molding compound (EMC) material layer, a third flexible dielectric material layer formed on the first rigid dielectric material layer, and a second EMC material layer formed on the third flexible dielectric material layer.

11. The package substrate of claim 10, further comprising:
    a conductive connection unit connecting the first wiring layer with the second wiring layer through the multi-layered dielectric layer.

12. The package substrate of claim 10, wherein each of the first, second and third flexible dielectric material layers is made of a material selected from the group consisting of polyethylene naphthalate (PEN), liquid crystal plastic (LCP), polyethylene terephthalate (PET) and polytetrafluoroethylene (PTFE).

13. The package substrate of claim 10, wherein said third flexible dielectric material layer comprises polyethylene naphthalate.

14. The package substrate of claim 10, wherein said third flexible dielectric material layer comprises liquid crystal plastic.

15. The package substrate of claim 10, wherein said third flexible dielectric material layer comprises polyethylene terephthalate.

16. The package substrate of claim 10, wherein said third flexible dielectric material layer comprises polytetrafluoroethylene.

\* \* \* \* \*